United States Patent
Kang et al.

(10) Patent No.: US 7,064,366 B2
(45) Date of Patent: Jun. 20, 2006

(54) FERROELECTRIC MEMORY DEVICES HAVING AN EXPANDED PLATE ELECTRODE

(75) Inventors: Hyun-Yul Kang, Incheon-si (KR); Yoon-Jong Song, Seoul (KR); Nak-Won Jang, Seoul (KR)

(73) Assignee: Samsung Electronics Co., Ltd. (KR)

( * ) Notice: Subject to any disclaimer, the term of this patent is extended or adjusted under 35 U.S.C. 154(b) by 40 days.

(21) Appl. No.: 10/787,424

(22) Filed: Feb. 26, 2004

(65) Prior Publication Data

US 2004/0169202 A1    Sep. 2, 2004

(30) Foreign Application Priority Data

Feb. 28, 2003    (KR)    ................. 10-2003-0012765

(51) Int. Cl.
  H01L 29/76    (2006.01)
  H01L 29/94    (2006.01)
  H01L 31/062   (2006.01)
  H01L 31/113   (2006.01)
  H01L 31/119   (2006.01)

(52) U.S. Cl. .............. 257/295; 257/296; 365/145; 365/149

(58) Field of Classification Search ................ None
  See application file for complete search history.

(56) References Cited

U.S. PATENT DOCUMENTS

| 5,198,994 | A | 3/1993 | Natori |
| 5,523,964 | A | 6/1996 | McMillan et al. |
| 6,844,583 | B1 * | 1/2005 | Kim et al. .................. 257/306 |
| 6,909,134 | B1 * | 6/2005 | Song et al. .................. 257/296 |
| 2005/0093042 | A1 * | 5/2005 | Nakazawa et al. .......... 257/295 |
| 2005/0117382 | A1 * | 6/2005 | Kim et al. .................. 365/145 |
| 2005/0244988 | A1 * | 11/2005 | Wang et al. .................. 438/3 |

FOREIGN PATENT DOCUMENTS

KR    2003-0001217    1/2003

OTHER PUBLICATIONS

Notice to Submit Response for corresponding Korean Application No. 10-2003-0012765 dated Aug. 26, 2004 (English Translation).

* cited by examiner

*Primary Examiner*—Ngân V. Ngô
(74) *Attorney, Agent, or Firm*—Myers Bigel Sibley & Sajovec

(57) ABSTRACT

Ferroelectric memory devices are formed on an integrated circuit substrate. A bottom interlayer dielectric layer is positioned on the integrated circuit substrate and a plurality of ferroelectric capacitors are arranged in a row and column relationship on the bottom interlayer dielectric layer. A top interlayer dielectric layer is disposed on a surface of the integrated circuit substrate including the plurality of ferroelectric capacitors. The top interlayer dielectric layer includes via holes disposed on and associated with ones of the ferroelectric capacitors. A plate electrode is formed in the top interlayer dielectric layer. The plate electrode extends into respective ones of the via holes to contact top surfaces of at least two neighboring ones of the plurality of ferroelectric capacitors. Methods or fabricating ferroelectric memory devices are also provided.

11 Claims, 7 Drawing Sheets

FERROELECTRIC MEMORY DEVICES HAVING AN EXPANDED PLATE ELECTRODE

RELATED APPLICATION

This application claims priority from Korean Application No. 10-2003-12765, filed Feb. 28, 2003, the disclosure of which is hereby incorporated herein by reference.

BACKGROUND OF THE INVENTION

The present invention relates to integrated circuit devices and, more particularly, to ferroelectric devices, such as memory devices, and methods for manufacturing the same.

Ferroelectric memory devices using ferroelectric layers have been considered as an alternative approach for certain memory applications, such as smart cards and the like. Such devices may have non-volatile characteristics that sustain previous data without supplied power and may operate with low power consumption in a manner similar to that of dynamic random access memory (DRAM) and static random access memory (SRAM).

Ferroelectric memory devices are generally divided into two categories. The first category includes devices using a ferroelectric capacitor as described, for example, in U.S. Pat. No. 5,523,964. The second category includes devices having a ferroelectric field emission transistor (FET) as described, for example, in U.S. Pat. No. 5,198,994. These devices may provide higher-speed read and write operations and/or lower power consumption than other types of memory devices.

FIG. 1 is a cross-sectional view illustrating a conventional ferroelectric memory device. As shown in FIG. 1, a field isolation layer 12 is disposed in an integrated circuit (semiconductor) substrate 10 to define active region(s) 14. A plurality of gate electrodes 20 (i.e., word lines) are disposed crossing over the active regions 14. Source and drain regions 18 and 16 are formed in the active region 14 adjacent to the gate electrodes 20. A first bottom interlayer dielectric layer 24 is formed on the substrate 10 with the gate electrodes 20 thereon. Bit lines 26 connected to the drain region 18 are disposed penetrating through the first bottom interlayer dielectric layer 24. A second bottom interlayer dielectric layer 28 is formed on a surface of the first bottom interlayer dielectric layer 24 including the bit lines 26. A storage node plug 32 is connected to each of the source regions 18, penetrating the second and first bottom interlayer dielectric layers 28 and 24. A source pad 22s may be disposed on the source region 18 and a drain pad 22d may be disposed on the drain region 16. The storage node plug 32 and the bit line 26 may be connected to the source pad 22s and the drain pad 22d, respectively. Capacitors 40, which are connected to the storage node plugs 32, respectively, are formed on the second bottom interlayer dielectric layer 28. Each of the capacitors 40 includes a bottom electrode 34, a capacitor dielectric layer 36 and a top electrode 38. The bottom electrode 34 is directly in contact with the storage node plug 32, the capacitor dielectric layer 36 is placed on the bottom electrode 34 and the top electrode 38 is disposed on the capacitor dielectric layer 36.

A top insulating layer 42 is formed on the substrate including the capacitors 40. The top insulating layer 42 includes contact holes 44 exposing top surfaces of each the capacitors 40. A plate electrode 46 is formed in the contact hole 44 and directly in contact with the top surfaces of the capacitors 40. Conventionally, the capacitors 40 are disposed on the second bottom interlayer dielectric layer 28 along rows and columns defining a memory array and the plate electrodes 46 are directly in contact with the capacitors 40 arranged on one row, respectively.

Because the plate electrodes 46 of the conventional ferroelectric memory device are connected to the capacitors arranged on a row, respectively, as integration density increases, capacitor area and intervals between capacitors may decrease and the contact holes 44 exposing a top surface of the capacitor may be difficult to form. When the contact holes 44 are formed, the aspect ratio of the contact hole may be high due to the relatively thick top insulating layer 42. As a result, it may be difficult to deposit the plate electrode 46 and contact resistance may increase.

SUMMARY OF THE INVENTION

Embodiments of the present invention include ferroelectric memory devices formed on an integrated circuit substrate. A bottom interlayer dielectric layer is positioned on the integrated circuit substrate and a plurality of ferroelectric capacitors are arranged in a row and column relationship on the bottom interlayer dielectric layer. A top interlayer dielectric layer is disposed on a surface of the integrated circuit substrate including the plurality of ferroelectric capacitors. The top interlayer dielectric layer includes via holes disposed on and associated with ones of the ferroelectric capacitors. A plate electrode is formed in the top interlayer dielectric layer. The plate electrode extends into respective ones of the via holes to contact top surfaces of at least two neighboring ones of the plurality of ferroelectric capacitors. A plurality of plate electrodes may be provided in the memory device, each extending into respective ones of the via holes to contact top surfaces of at least two neighboring ones of the plurality of ferroelectric capacitors.

In other embodiments of the present invention, the plate electrode is a local plate line and the local plate line directly contacts the top surfaces of the ferroelectric capacitors arranged on at least two rows. A main plate line may further be included that directly contacts a top surface of the local plate line through a slit type contact hole penetrating the top interlayer dielectric layer.

In further embodiments of the present invention, the plate electrode includes a local plate electrode directly contacting the top surfaces of at least two neighboring ferroelectric capacitors and a main plate line directly contacting a top surface of a plurality of local plate electrodes arranged on at least one row through a silt type contact hole penetrating the top interlayer dielectric layer.

Each of the ferroelectric capacitors may be electrically connected to a predetermined region of the integrated circuit substrate through a storage node contact hole penetrating the bottom interlayer dielectric layer. A diameter of the storage nod contact hole may be greater at an end thereof proximate an associated one of the ferroelectric capacitors than at an end thereof proximate the integrated circuit substrate.

In other embodiments of the present invention, the ferroelectric capacitors are stacked capacitors including a bottom electrode, a ferroelectric pattern and a top electrode. The plate electrode directly contacts the top electrodes of ferroelectric capacitors arranged on at least two neighboring rows. A hydrogen barrier layer pattern may be interposed between the ferroelectric capacitors and the top interlayer dielectric layer with the via holes of the top interlayer dielectric layer extending through the hydrogen barrier layer to expose the top surfaces of the ferroelectric capacitors. The hydrogen barrier layer may extend along sidewalls of the ferroelectric capacitors and an edge portion of the top surfaces of the ferroelectric capacitors.

In further embodiments of the present invention, a ferroelectric memory device includes a plurality of cell transistors arranged in a row and column relationship on an integrated circuit substrate. A bottom interlayer dielectric layer covers a surface of the integrated circuit substrate in a region including the plurality of cell transistors. Ferroelectric capacitors are arranged in a row and column relationship on the bottom interlayer dielectric layer in the region including the plurality of cell transistors. The ferroelectric capacitors are electrically connected to associated ones of the cell transistors through respective storage nod contact holes penetrating the bottom interlayer dielectric layer. A top interlayer dielectric layer is formed on the bottom interlayer dielectric layer including the ferroelectric capacitors. The top interlayer dielectric layer includes a plurality of via holes disposed on the ferroelectric capacitors. A plurality of plate electrodes are formed in the top interlayer dielectric layer and extend into respective ones of the via holes in the top interlayer dielectric layer to contact top surfaces of at least two neighboring ones of the ferroelectric capacitors.

In other embodiments of the present invention, a slit type contact hole penetrates the top interlayer dielectric layer to expose plate electrodes arranged on at least one row and a main plate line covers the silt type contact hole. The plate electrodes may be local plate lines, each of which directly contacts the top surfaces of ferroelectric capacitors arranged on at least two rows. The ferroelectric capacitors may be stacked capacitors including a bottom electrode, a ferroelectric pattern and a top electrode and each of the plate electrodes may directly contact at least two neighboring top electrodes.

In further embodiments of the present invention, methods of forming a ferroelectric memory device include forming a bottom interlayer dielectric layer on an integrated circuit substrate. A plurality of ferroelectric capacitors arranged in a row and column relationship are formed on the bottom interlayer dielectric layer. A top interlayer dielectric layer including via holes extending to the ferroelectric capacitors is formed on the bottom interlayer dielectric layer and the plurality of ferroelectric capacitors. A plurality of plate electrodes is formed on the top interlayer dielectric layer, each of the plate electrodes extending into ones of the via holes of the top interlayer dielectric layer to contact a top surface of at least two neighboring ferroelectric capacitors.

In other embodiments of the present invention, forming the plurality of ferroelectric capacitors includes forming a bottom electrode layer on the bottom interlayer dielectric layer, forming a ferroelectric layer on the bottom electrode layer and forming a top electrode layer on the ferroelectric layer. The top electrode layer, the ferroelectric layer and the bottom electrode layer are patterned to form a plurality of stacked capacitors arranged in a row and column relationship on the bottom interlayer dielectric layer.

In further embodiments of the present invention, forming the top interlayer dielectric layer and forming the plate electrodes includes forming a first top interlayer dielectric layer on a region of the integrated circuit substrate including the ferroelectric capacitors and patterning the first top interlayer dielectric layer to form a plurality of via holes exposing the top surfaces of the ferroelectric capacitors. A bottom plate layer is formed on the first top interlayer dielectric layer and extending into the plurality of via holes. The bottom plate layer is patterned to form a plurality of plate electrodes, each of which extends through ones of the via holes to contact the top surfaces of at least two neighboring ferroelectric capacitors. A second top interlayer dielectric layer is formed on the first top interlayer dielectric layer and the plate electrodes. The plate electrodes may contact the top surfaces of ferroelectric capacitors arranged on at least two neighboring rows.

In other embodiments of the present invention, forming the first top interlayer dielectric layer is preceded by forming a hydrogen barrier layer on the bottom interlayer dielectric layer and the plurality of ferroelectric capacitors. Forming the top interlayer dielectric layer includes forming the top interlayer dielectric layer on the hydrogen barrier layer including via holes extending through the hydrogen barrier layer to the ferroelectric capacitors. The hydrogen barrier layer may remain on sidewalls of the ferroelectric capacitors and an edge portion of the top surfaces of the ferroelectric capacitors after the via holes are formed in the top interlayer dielectric layer.

In further embodiments of the present invention, the method further includes patterning the second top interlayer dielectric layer to form a slit type contact hole parallel to a row that exposes plate electrodes on at least one row. A main plate line is formed covering the slit type contact hole.

In other embodiments of the present invention, ferroelectric memory devices include an expanded plate electrode electrically connected to top electrodes arranged on at least two neighboring rows. The ferroelectric memory device includes a bottom interlayer dielectric layer formed on the semiconductor substrate. A plurality of ferroelectric capacitors are disposed on the bottom interlayer dielectric layer along rows and columns. A top insulating layer covers a surface of the semiconductor substrate with a plurality of ferroelectric capacitors. The top insulating layer includes a plurality of via holes disposed on each of the ferroelectric capacitors. The top interlayer dielectric layer may include first and second interlayer dielectric layers. A plurality of plate electrodes are formed in the top interlayer dielectric layer parallel to the column. Each of the plate electrodes is directly connected to top surfaces of the neighboring ferroelectric capacitors, which are arranged at least two neighboring rows. As a result, the ferroelectric capacitors arranged on at least two rows share one plate electrode.

Each of the ferroelectric capacitors may include a top electrode, a ferroelectric layer pattern and a top electrode that are sequentially stacked. Each of the plate lines may be directly connected to the top electrodes arranged on at lease two neighboring rows.

In further embodiments of the present invention, methods of fabricating a ferroelectric memory device with expanded plate electrode directly connected to top electrodes are provided. The top electrodes are arranged on at least two neighboring rows. The methods include forming a bottom interlayer dielectric layer, a ferroelectric layer and a top electrode layer on a semiconductor substrate, and sequentially patterning the top electrode layer, the ferroelectric layer and the bottom electrode layer. Therefore, each of the ferroelectric capacitors includes a bottom electrode, a ferroelectric layer pattern and a top electrode. In this case, each of the plate lines is in contact with the top electrode arranged on at least two neighboring rows. The first top interlayer dielectric layer is patterned to form a plurality of via holes exposing a top surface of each the ferroelectric capacitor. A bottom plate layer is formed on a surface of the semiconductor substrate with the via holes. The bottom plate layer is patterned to form a local plate electrode directly connected with top surfaces of the at least two neighboring ferroelectric capacitors through via holes. A second top interlayer dielectric layer is conformally formed on a surface of the semiconductor substrate with the local plate line. The second top interlayer dielectric layer is patterned to form slit type via holes parallel to the main word lines. The slit type via holes penetrate the second top interlayer dielectric layer to expose the local plate electrodes disposed on at least one column. A main plate line is formed covering the slit type via holes. Alternatively, the bottom plate layer may be patterned to form local plate line directly connected to top surfaces of the ferroelectric capacitors disposed on at least two neighboring columns through the via holes. The slit type via hole and the plate line may be formed or not.

Each of the ferroelectric capacitors may be formed of the bottom electrode, the ferroelectric pattern and the top electrode that are sequentially stacked. The bottom electrode is electrically connected to a specific region of the semiconductor substrate through a storage node contact hole penetrating the bottom interlayer dielectric layer. The storage node contact hole may be longer in a top diameter than a bottom diameter. In addition, a hydrogen barrier layer may be formed on at least sidewalls of the ferroelectric pattern.

BRIEF DESCRIPTION OF THE DRAWINGS

Other features of the present invention will be more readily understood from the following detailed description of the invention when read in conjunction with the accompanying drawings, in which.

DETAILED DESCRIPTION OF THE INVENTION

Figure 1:
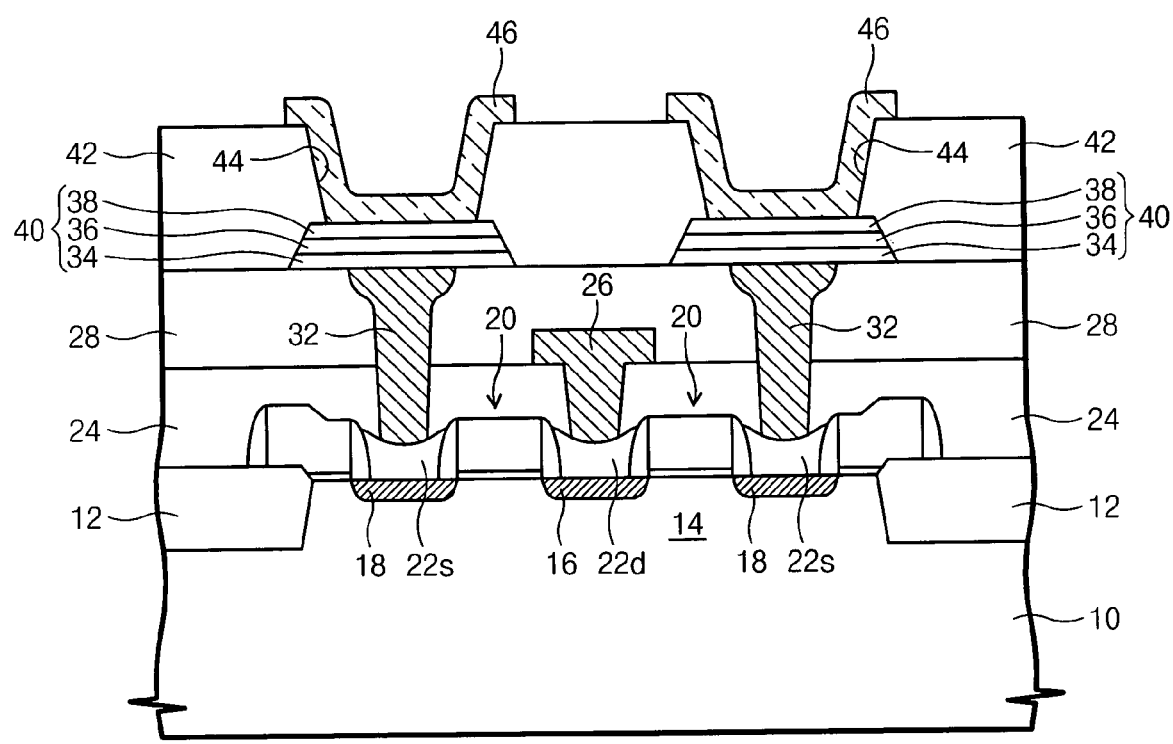
FIG. 1 is a cross-sectional view illustrating a conventional ferroelectric memory device.

The present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the relative sizes of regions may be exaggerated for clarity. It will be understood that when an element such as a layer, region or substrate is referred to as being "on" another element, it can be directly on the other element or intervening elements may also be present. In contrast, when an element is referred to as being "directly on" another element, there are no intervening elements present. Moreover, each embodiment described and illustrated herein includes its complementary conductivity type embodiment as well. Like numbers refer to like elements throughout the specification.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in the Figures is turned over, elements described as being on the "lower" of other elements would then be oriented on "upper" of the other elements. The exemplary term "lower", can therefore, encompasses both an orientation of lower and upper, depending of the particular orientation of the figure.

Figure 2:
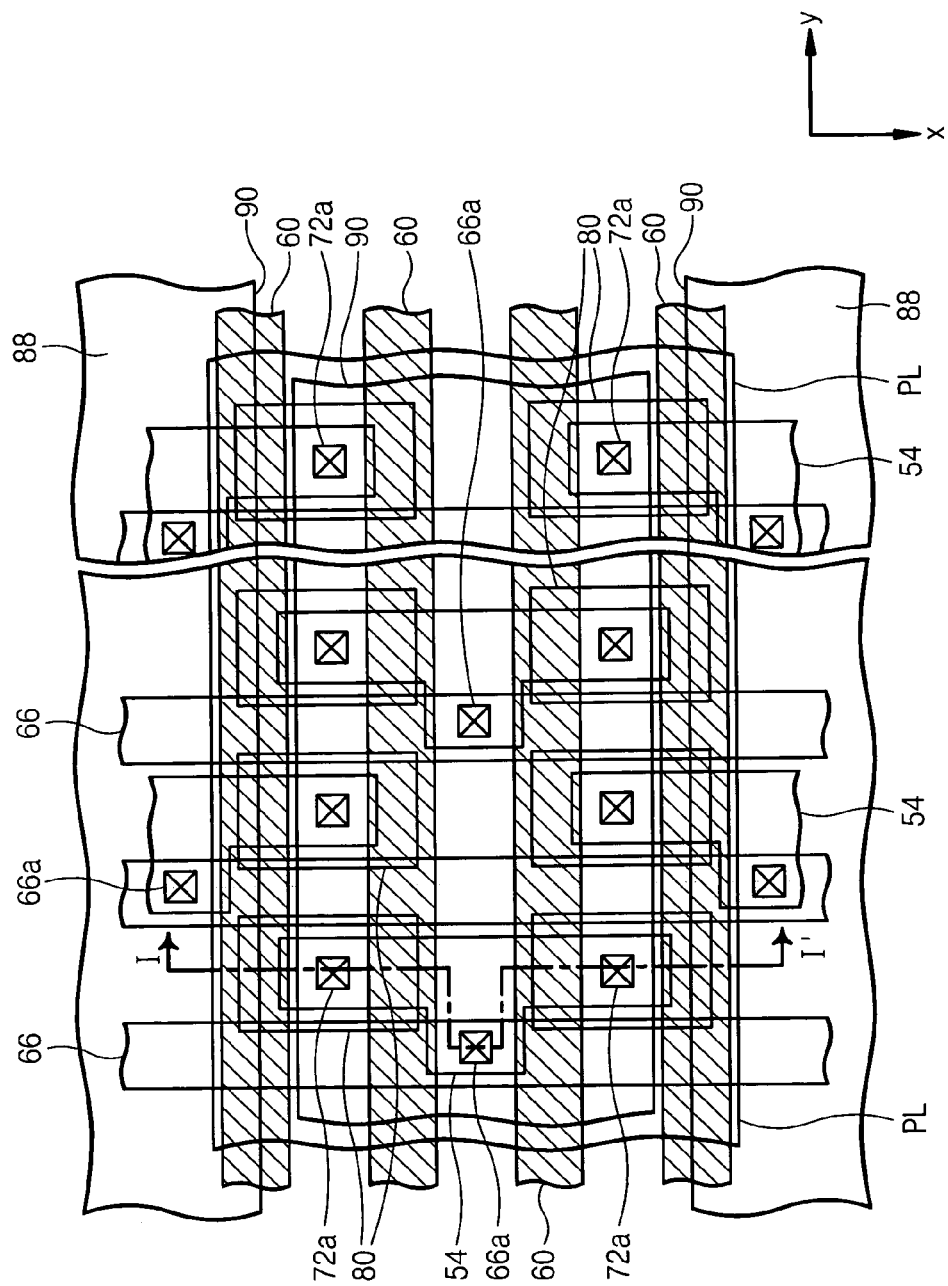
FIG. 2 is a top plan view illustrating a cell array region of a ferroelectric memory device according to some embodiments of the present invention.

Integrated circuit devices and methods for forming such devices in accordance with embodiments of the present invention will now be described with reference to the FIG. 2. FIG. 2 is a top plan view illustrating a portion of a cell array region of a ferroelectric memory device according to some embodiments of the present invention.

Figure 3:
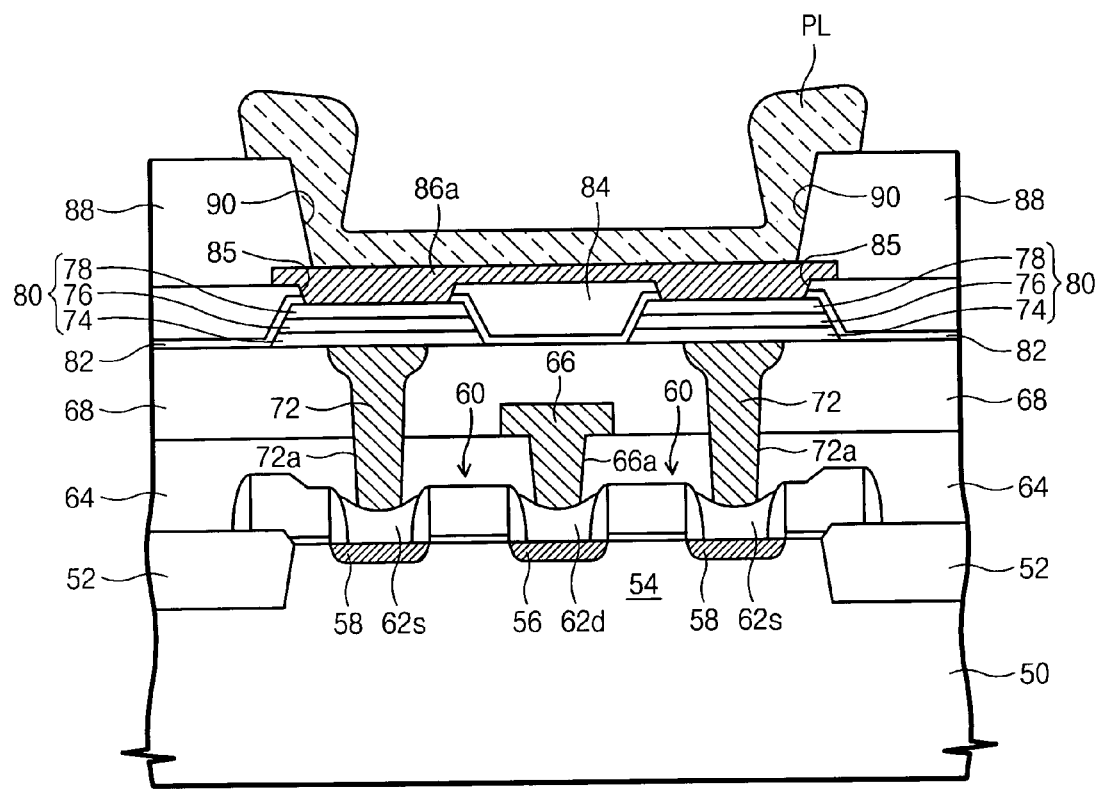
FIG. 3 is a cross-sectional view illustrating a ferroelectric memory device according to some embodiments of the present invention.

FIG. 3 is a cross-sectional view illustrating a ferroelectric memory device according to some embodiments of the present invention.

Referring now to FIGS. 2 and 3, field isolation layers 52 (FIG. 3) are disposed in a specific region of an integrated circuit (semiconductor) substrate 50. The field isolation layers 52 define a plurality of active regions 54 in a generally two dimensional array. A plurality of gate electrodes 60 (i.e., word lines) are disposed crossing over the active regions 54 and the field isolation layers 52. The gate electrodes 60 are parallel to a row direction (i.e. a y-axis of the cell array). Therefore, each of the active regions 54 is divided into three parts. A common drain region 56 is formed in an active region 54 between a pair of gate electrodes 60 and source regions 58 are formed in the active region 54 at both sides of the common drain region 56. Cell transistors are formed at intersections of the gate electrodes 60 and the active regions 54 to dispose cell transistors along columns and rows (i.e., x and y axes).

A drain pad 62d may be formed on the common drain region 56 and source pads 62s may be formed on the source regions 58. A first bottom interlayer dielectric layer 64 covers a surface of the substrate 50 where the cell transistors are positioned. A plurality of bit lines 66 are disposed in the first bottom interlayer dielectric layer 64 and cross over the word lines. Each bit line 66 is electrically connected to the common drain region 56 of its row through a bit line contact hole 66a. A second bottom interlayer dielectric layer 68 covers a surface of the substrate 50 including the bit lines 66. The source regions 58 are exposed by storage node contact holes 72a penetrating the first and second bottom interlayer dielectric layers 64 and 68.

The top sidewalls of the storage node contact holes 72a may have a sloped profile as illustrated in FIG. 3. A contact plug 72 fills each of the storage node contact holes 72a. As a result, a diameter of the contact plug 72 may be greater at a top end thereof than at a bottom end.

A plurality of ferroelectric capacitors 80 are disposed on a surface of the substrate 50 including the contact plugs 72 along rows and columns (y and x axes) of the cell array. Each of the ferroelectric capacitors 80 includes a bottom electrode 74, a ferroelectric pattern 76 and a top electrode 78. The bottom electrodes 74 are disposed on the contact plugs 72, respectively. As a result, the bottom electrode 74 is electrically connected to an associated source region 58 through a contact plug 72. A first top interlayer dielectric layer 84 covers the ferroelectric capacitors 80.

As shown in the embodiments of FIG. 3, a hydrogen barrier layer 82 may be interposed between the first top interlayer dielectric layer 84 and the ferroelectric capacitors 80. The hydrogen barrier layer 82 may be formed of titanium oxide ($TiO_2$), aluminum oxide ($Al_2O_3$), silicon nitride ($Si_3N_4$) and/or combinations thereof. The hydrogen barrier layer 82 may limit or prevent the penetration of hydrogen atoms into the ferroelectric pattern 76. The doped hydrogen atoms may otherwise reduce the performance of the ferroelectric pattern 76. For example, the doped hydrogen atoms may react with oxygen and hydrogen atoms in a ferroelectric layer such as a PZT (Pb, Zr and TiO$_3$) layer and form oxygen vacancies therein. Such oxygen vacancies may degrade a polarization characteristic of the ferroelectric pattern 76, which could result in a malfunction of the ferroelectric memory device.

Furthermore, if the hydrogen atoms are trapped in the interface between the ferroelectric pattern 76 and the top and bottom electrodes 78, 74, an energy barrier therebetween may be lowered. This may degrade a leakage current characteristic of the ferroelectric capacitor. Therefore, the hydrogen barrier layer 82 may improve the characteristics and/or reliability of the ferroelectric capacitor 80.

The first top interlayer dielectric layer 84 includes via holes 85 disposed on the ferroelectric capacitors 80. A plurality of local plate lines 86a are disposed on the first top interlayer dielectric layer 84. The local plate lines 86a are disposed parallel to the row direction, that is, a y-axis of the cell array. In addition, the local plate lines 86a directly contact top surfaces of the ferroelectric capacitors 80 arranged on at least two neighboring rows through the via holes 85, respectively. A second top interlayer dielectric layer 88 covers a surface of the substrate 50 including the local plate lines 86a.

A main plate line PL may be disposed in the top interlayer dielectric layer 85. The main plate line PL is illustrated as being electrically connected to the local plate line 86a through a slit type contact hole 90 penetrating the second top interlayer dielectric layer 88. The slit type contact hole 90 is parallel to the row direction (the y axis). As show in FIG. 3, the width of the silt type contact hole 90 is larger relative to the cell array than a diameter of the via hole 44 illustrated in FIG. 1.

The local plate line 86a and the main plate line PL provide a plate electrode. The local plate line 86a may be a local plate electrode directly connected to top surfaces of at least two neighboring ferroelectric capacitors 80. In this case, the slit type contact hole 90 may expose top surfaces of the local plate electrode disposed on at least one column. The main plate electrode PL is shown in the embodiments of FIG. 3 as directly in contact with top surfaces of the local plate electrodes. In addition, the plate electrode may include only the local plate line 86a.

Methods for fabricating a ferroelectric memory device according to some embodiments of the present invention will now be described with reference to FIGS. 4–10. FIGS. 4 through 10 are cross-sectional views taken along a line I–I' of FIG. 2.

Figure 4:
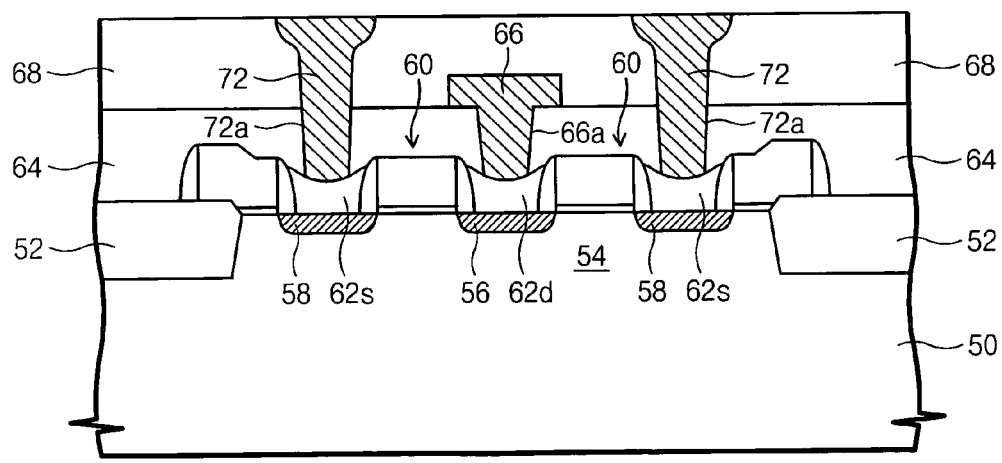
FIGS. 4 through 10 are cross-sectional views taken along a ling I–I' of FIG. 2, illustrating methods for fabricating a ferroelectric memory device according to some embodiments of the present invention.

Referring first to FIG. 4, a plurality of active regions 54 of a cell array, one of which is shown in FIG. 4, are defined by forming field isolation layers 52 in a specific region of the substrate 50. A gate insulating layer, a gate conductive layer and a capping insulating layer are formed on a surface of the substrate 50 including the active region(s) 54, which layers are patterned, for example, sequentially, to form a plurality of parallel gate patterns 60 crossing over the active region(s) 54 and the field isolation layer 52. Each of the gate patterns 60 may include a gate insulating pattern, a gate electrode and a capping insulating pattern that are sequentially stacked. The active region(s) 54 extend across a pair of gate electrodes 60, respectively. Gate electrodes 60 may, for example, be word lines of a memory cell array of an integrated circuit device.

Impurity ions may be injected into the active region(s) 54 using, for example, the gate patterns 60 and the field isolation layer 52 as an ion implantation mask. Three impurity regions may be formed thereby in each of the active region(s) 54. One of the three impurity regions corresponds to a common drain region 56 and the others correspond to source regions 58. Therefore, for the embodiments illustrated in FIG. 4, cell transistors of the memory cell array may be two-dimensionally disposed on the substrate 50 along row and column directions. Spacers may be continuously formed on sidewalls of the gate pattern 60 using conventional methods.

A drain pad 62d may be more formed at a gap region between the gate patterns 60 on the common drain region 56. Furthermore, source pads 62s may be formed at a gap region between the gate patterns 60 on the source regions 58.

As shown in FIG. 4, a first bottom interlayer dielectric layer 64 may be formed on the surface of the substrate 50 over the region of the cell array. The first bottom interlayer dielectric layer 64 may be patterned to form bit line contact holes 66a exposing the drain pads 62d. As shown in FIG. 4, a plurality of parallel bit lines 66 are formed on the first bottom interlayer dielectric layer 64. The bit lines 66 are electrically connected to the common drain regions 56 through the bit line contact holes 66a. The bit lines 66 cross over the word lines 60 as illustrated in FIG. 2.

A second bottom interlayer insulting layer 68 is formed on the surface of the substrate 50 including the bit line 66. The first and second bottom interlayer dielectric layers 64 and 68 together define a bottom interlayer dielectric layer. The first and second bottom interlayer dielectric layers 64 and 68 may be patterned to form storage node contact hole(s) 72a exposing the source pads 62s. The storage node contact hole(s) 72a may be formed, for example, by a wet etch and/or a dry etch process in order to increase a top diameter thereof. In such embodiments, the top sidewalls of the storage node contact hole(s) 72a may have sloped profiles as illustrated in FIG. 4. Such a configuration may decrease resistance between the bottom electrode 74 (see FIG. 5) and the source region 58. Contact plug(s) 72 are formed in the storage node contact hole(s) 72a.

Figure 5:
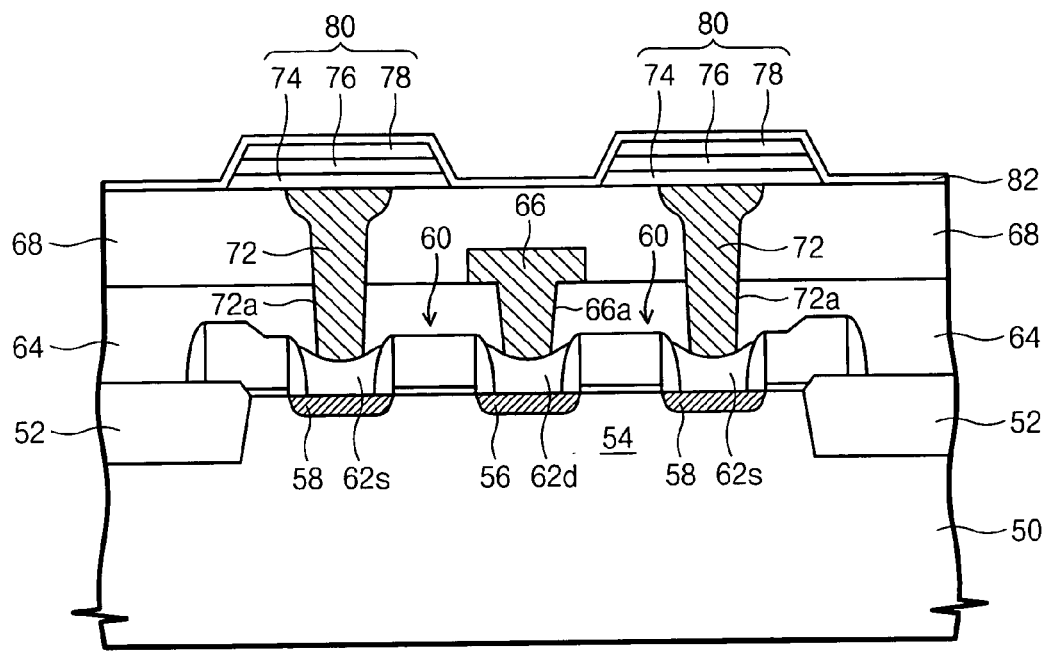

Referring now to FIG. 5, a bottom electrode layer, a ferroelectric layer and a top electrode layer may be sequentially formed on the contact plug(s) 72 and the second bottom interlayer dielectric layer 68 and the formed layers may be successively patterned to form a plurality of ferroelectric capacitors 80 two-dimensionally disposed along rows and columns of the cell array. As shown in the embodiments of FIG. 5, each of the ferroelectric capacitors 80 includes a bottom electrode 74, a ferroelectric pattern 76 and a top electrode 78 that are sequentially stacked. The bottom electrode 74 is connected to the contact plug 72 to electrically connect the ferroelectric capacitors 80 to associated ones of the source regions 58.

A hydrogen barrier layer 82 may be continuously and conformally formed on the substrate 50 including the ferroelectric capacitors 80 as shown in FIG. 5. The hydrogen barrier layer 83 may be formed of titanium oxide (TiO2), aluminum oxide ($Al_2O_3$), silicon nitride layer $Si_3N_4$) and/or a combination thereof.

Figure 6:
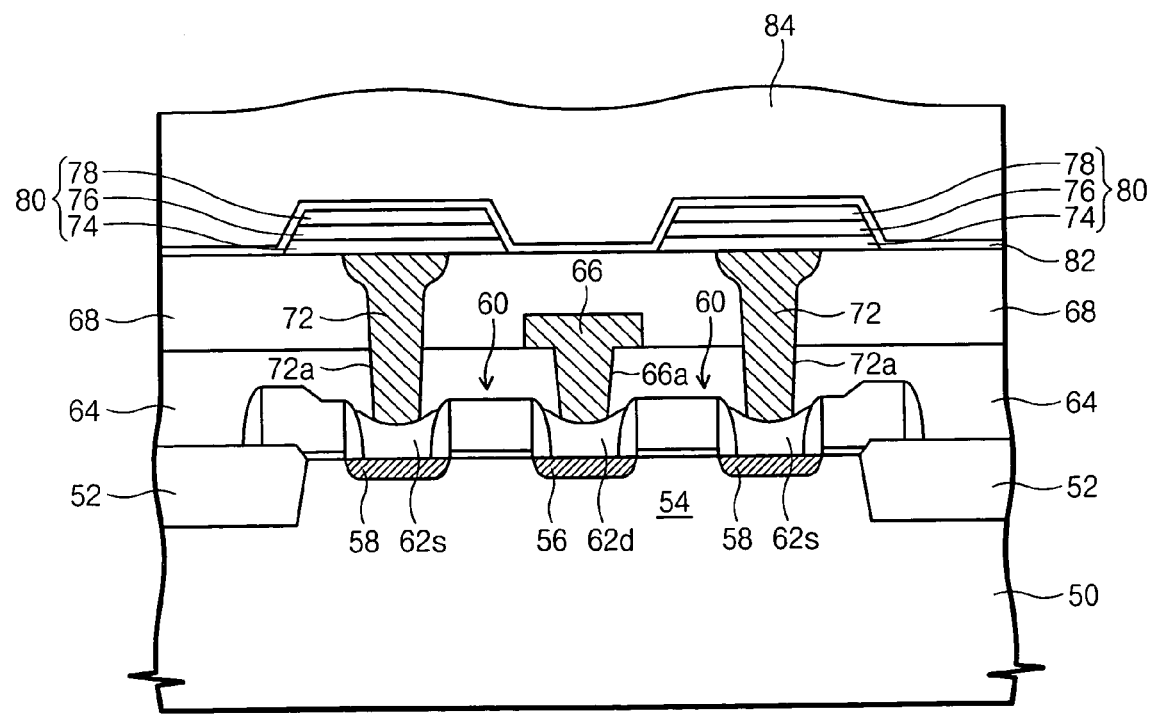

As shown in FIG. 6, a first top interlayer dielectric layer 84 is formed on the surface of the substrate 50 including the hydrogen barrier layer 82. The first top interlayer dielectric layer 84 may be formed, for example, by stacking an undoped silicate glass (USG) layer and/or a spun-on-glass (SOG) layer.

Figure 7:
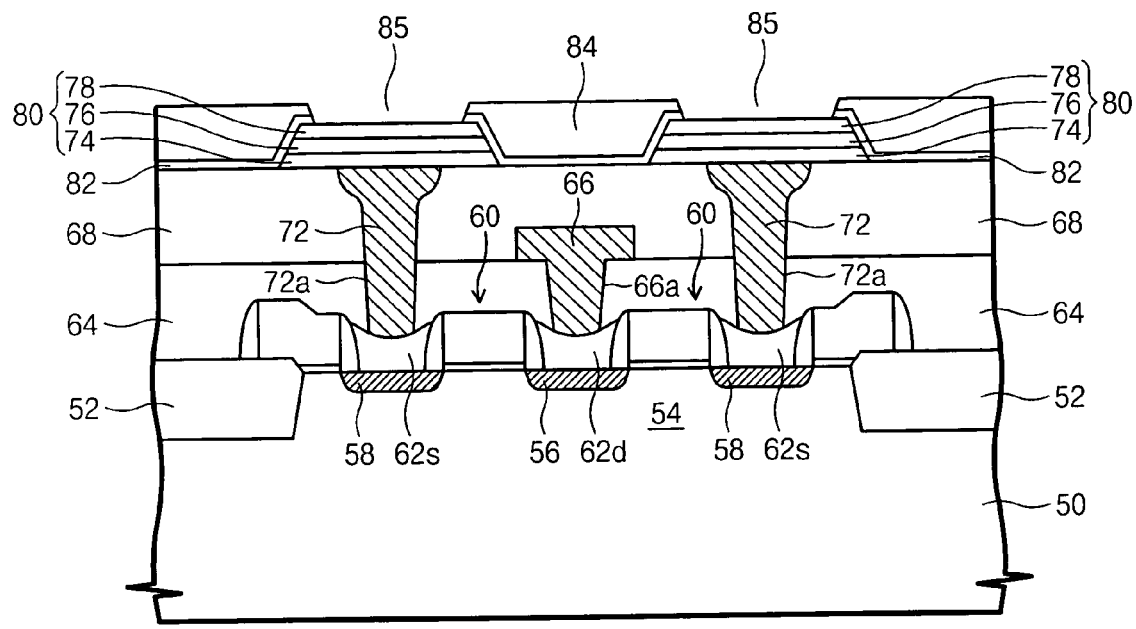
Figure 8:
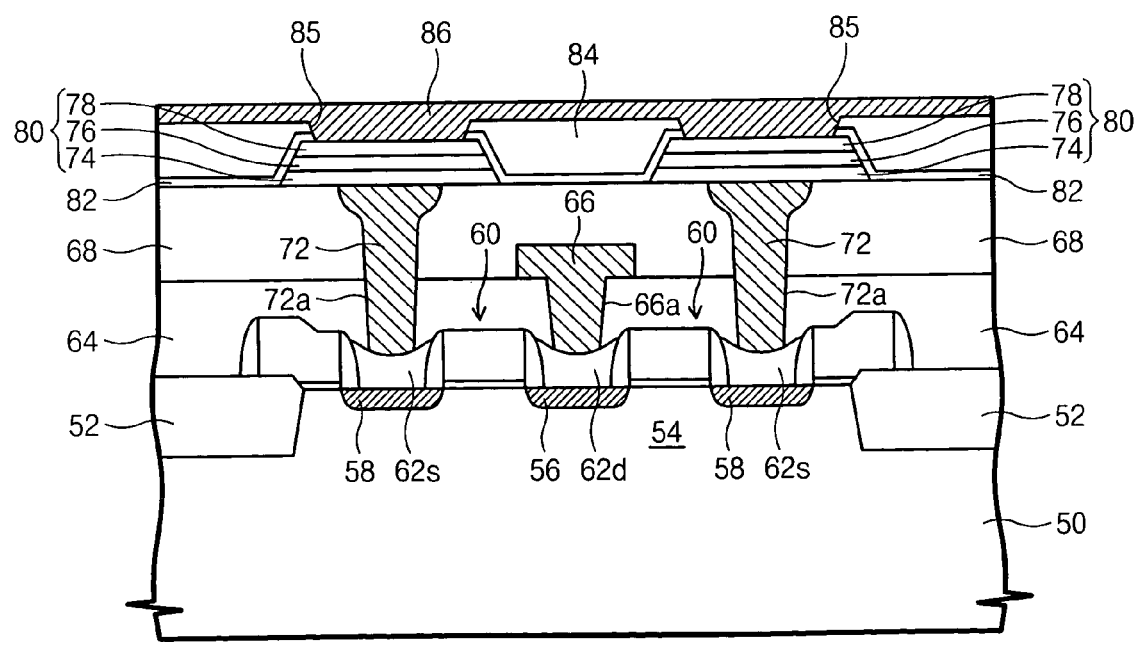

Referring now to FIG. 7, the first top interlayer dielectric layer 84 is planarized or etched back to provide a desired thickness to the top interlayer dielectric layer 84. The desired thickness of the remaining first top interlayer dielectric layer 84 may be selected based on a desired aspect ratio of a subsequently formed via hole 85 and/or a gap fill characteristic of the bottom plate layer 86 (FIG. 8). The first top interlayer dielectric layer 84 and the hydrogen barrier layer 82 are patterned to form the via hole(s) 85 exposing top surfaces of respective ones of the ferroelectric capacitors 80. For the embodiments illustrated in FIG. 7, the hydrogen barrier layer 82 covers sidewalls of the ferroelectric capacitors 80 including sidewalls of the ferroelectric patterns 76. As a result, the injection of hydrogen atoms into the ferroelectric patterns 76 may be limited or even prevented. If hydrogen atoms are injected into the ferroelectric pattern 76, the performance characteristics of the ferroelectric capacitor 80, such as polarity and leakage current characteristic, may be deteriorated. Therefore, the hydrogen barrier layer 82 may be used in some embodiments of the present invention and may provide improved characteristics of the ferroelectric capacitors 80.

As shown in FIG. 8, a bottom plate layer 86 is formed on the surface of the substrate 50 including the via holes 85. In the embodiments of FIG. 8, the bottom plate layer 86 is directly in contact with top surfaces of the ferroelectric capacitors 80 through the via holes 85.

The first top interlayer dielectric layer 84 and the hydrogen barrier layer 82 may be planarized using, for example, a chemical mechanical polishing (CMP) process, to expose the top surfaces of the ferroelectric capacitors 80. The bottom plate layer 86 may be formed on the first top interlayer dielectric layer 84. However, an exposure ratio of the top electrode 78 may be non-uniform, depending on a polishing uniformity of each wafer region. Furthermore, the hydrogen barrier layer 82 on sidewalls of the ferroelectric pattern 76 may be removed, which may degrade the characteristics of the a ferroelectric capacitor characteristic and reduce uniformity between capacitors.

Figure 9:
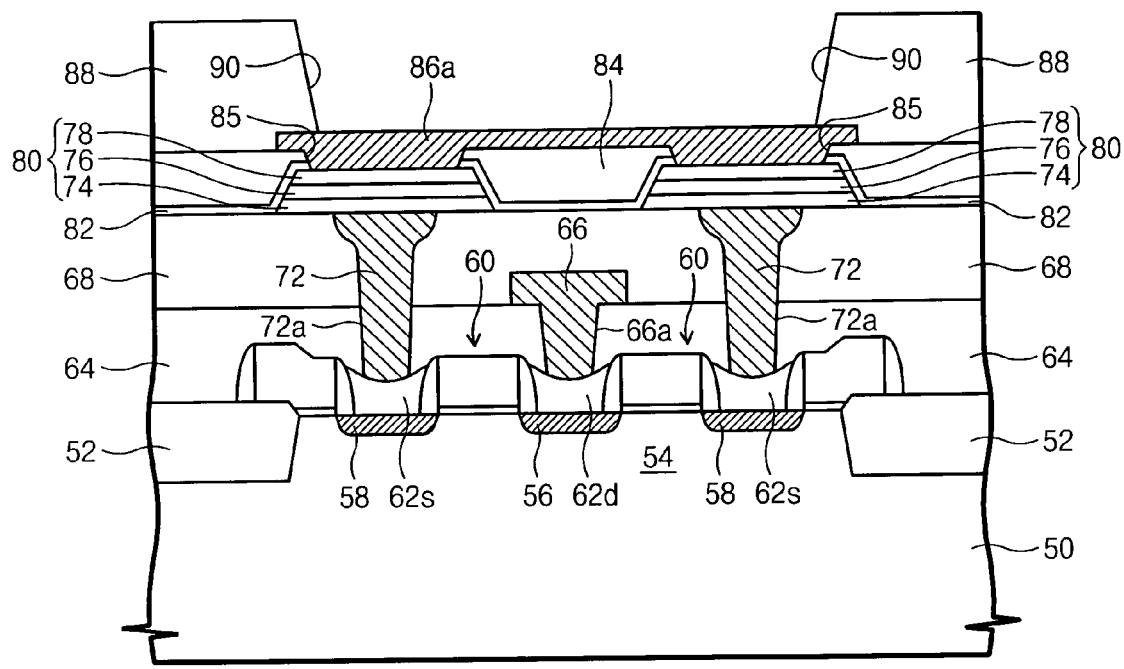

Referring now to the embodiments illustrated in FIG. 9, the bottom plate layer 86 is patterned to form a local plate electrode 86a directly connected to the top surfaces of at least two neighboring ferroelectric capacitors 80. The local plate electrode 86 may be directly in contact with the top surfaces of four (i.e., two along each of the x- and y-axes illustrated in FIG. 2) neighboring ferroelectric capacitors 80. In other embodiments of the present invention, the local plate electrode 86 may include a plurality of local plate lines parallel to the word lines 60. In other words, the plurality of local plate lines may be parallel to the row direction (i.e., the y-axis as illustrated in FIG. 2). The local plate lines may be directly connected to a plurality of top electrodes 78 arranged on two neighboring rows, respectively.

A second top interlayer dielectric layer 88 is formed on the surface of the substrate 50 including the local plate electrodes 86a. The second top interlayer dielectric layer 88 may be patterned to form slit-type via holes 90 exposing the local plate electrodes 86a. The slit-type via holes 90 expose a top surface of the local plate electrode 86a arranged on at least one row. In some embodiments of the present invention, the slit-type via hole 90 is wider than those of the prior art. In particular, the slit-type via hole 90 may be formed by a wet etching and/or a dry etching process to reduce an aspect ratio of the slit-type via hole 90. As a result, the aspect ratio of the slit-type via hole 90 may be significantly reduced compared to the prior art. In addition, the exposure area of the local plate electrode 86a may be increased.

Figure 10:
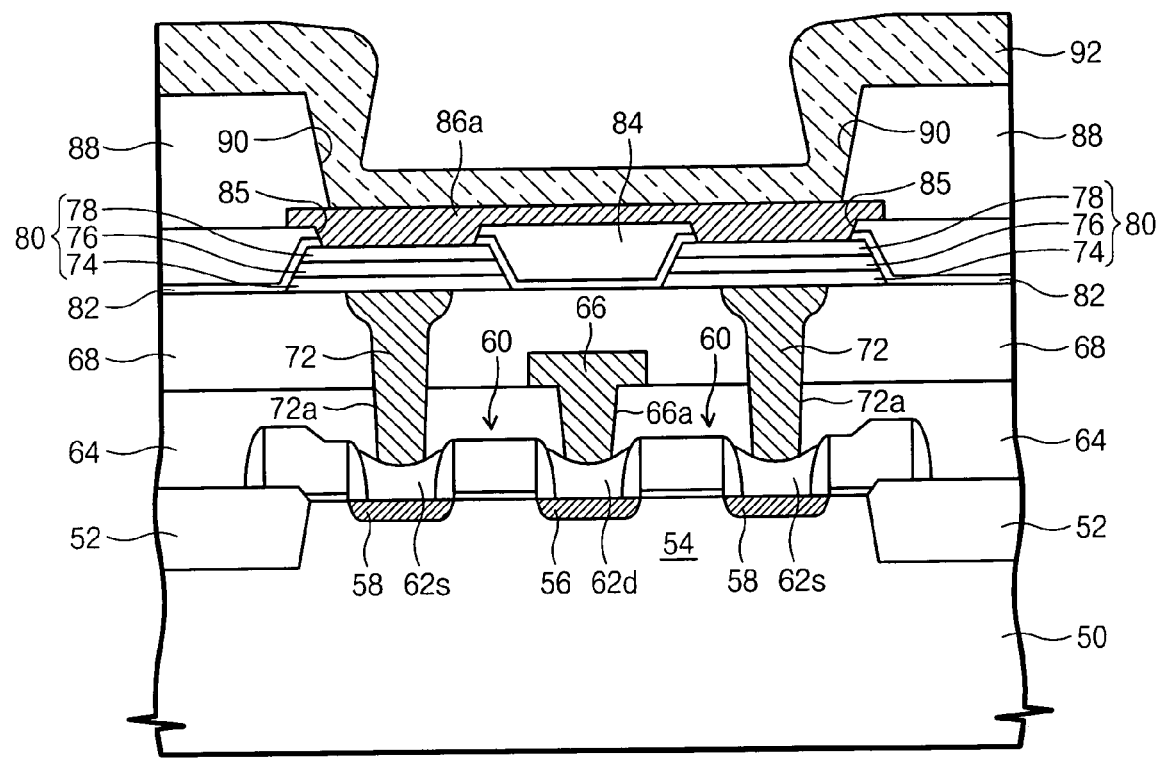

Referring now to FIG. 10, a top plate layer 92 (e.g., a metal layer) is shown formed on the surface of the cell array region including the slit-type via hole 90. Due to the aspect ratio of the slit-type via hole 90, the top plate layer 92 may have good step coverage. The top plate layer is patterned to define main plate line PL (shown in FIG. 3) covering the slit-type via hole 90.

In embodiments where the local plate electrode 86a is the local plate line, the main plate line PL may not be required. However, the main plate line PL as well as the local plate line shaped plate electrode 86a may be included to provide have good electric conductivity.

According to some embodiments of the present invention, one plate line is directly in contact with top electrodes of the ferroelectric capacitors arranged on at least two neighboring rows. As such, a reliable contact structure may be provided between the plate line and the top electrode. In addition, the plate line may be directly in contact with the top electrodes through via holes disposed on top surfaces of each of the ferroelectric capacitors, such that the ferroelectric capacitors can maintain desired characteristics and process uniformity may be increased. Embodiments of the capacitors of the present invention may be used to improve integration density and reliability of integrated circuit devices such as ferroelectric memory devices.

Furthermore, some embodiments of the present invention provide ferroelectric memory devices having low contact resistance between a plate electrode and a top electrode and methods of fabricating (forming) the same. Easy electrical connections may also be provided between the plate electrode and a top electrode of the ferroelectric memory devices and uniformity of ferroelectric characteristics may be improved.

It should be noted that many variations and modifications may be made to the embodiments described above without substantially departing from the principles of the present invention. All such variations and modifications are intended to be included herein within the scope of the present invention, as set forth in the following claims.

What is claimed is:

1. A ferroelectric memory device comprising:
an integrated circuit substrate;
a bottom interlayer dielectric layer on the integrated circuit substrate;
a plurality of ferroelectric capacitors arranged in a row and column relationship on the bottom interlayer dielectric layer;
a top interlayer dielectric layer disposed on a surface of the integrated circuit substrate including the plurality of ferroelectric capacitors, the top interlayer dielectric layer including via holes disposed on and associated with ones of the ferroelectric capacitors;
a plate electrode formed in the top interlayer dielectric layer, the plate electrode extending into respective ones of the via holes to contact top surfaces of at least two neighboring ones of the plurality of ferroelectric capacitors; and
a hydrogen barrier layer pattern interposed between the ferroelectric capacitors and the top interlayer dielectric layer and extending along sidewalls of the ferroelectric capacitors and an edge portion of the top surfaces of the ferroelectric capacitors, the via holes of the top interlayer dielectric layer extending through the hydrogen barrier layer to expose the top surfaces of the ferroelectric capacitors.

2. The memory device of claim 1, wherein the plate electrode comprises a local plate line and wherein the local plate line directly contacts the top surfaces of the ferroelectric capacitors arranged on at least two rows.

3. The memory device of claim 2, further comprising a main plate line directly contacting a top surface of the local plate line through a slit type contact hole penetrating the top interlayer dielectric layer.

4. The memory device of claim 1, wherein the plate electrode comprises:
a local plate electrode directly contacting the top surfaces of at least two neighboring ferroelectric capacitors; and
a main plate line directly contacting a top surface of a plurality of local plate electrodes arranged on at least one row through a silt type contact hole penetrating the top interlayer dielectric layer.

5. The memory device of claim 1, wherein each of the ferroelectric capacitors is electrically connected to a predetermined region of the integrated circuit substrate through a storage node contact hole penetrating the bottom interlayer dielectric layer and wherein a diameter of the storage nod contact hole is greater at an end thereof proximate an associated one of the ferroelectric capacitors than at an end thereof proximate the integrated circuit substrate.

6. The memory device of claim 1, wherein the ferroelectric capacitors are stacked capacitors including a bottom electrode, a ferroelectric pattern and a top electrode and wherein the plate electrode directly contacts the top electrodes of ferroelectric capacitors arranged on at least two neighboring rows.

7. The memory device of claim 1, further comprising a plurality of plate electrodes, each extending into respective ones of the via holes to contact top surfaces of at least two neighboring ones of the plurality of ferroelectric capacitors.

8. A ferroelectric memory device, comprising:
a plurality of cell transistors arranged in a row and column relationship on an integrated circuit substrate;
a bottom interlayer dielectric layer covering a surface of the integrated circuit substrate in a region including the plurality of cell transistors;
ferroelectric capacitors arranged in a row and column relationship on the bottom interlayer dielectric layer in the region including the plurality of cell transistors, the ferroelectric capacitors being electrically connected to associated ones of the cell transistors through respective storage node contact holes penetrating the bottom interlayer dielectric layer;
a top interlayer dielectric layer formed on the bottom interlayer dielectric layer including the ferroelectric capacitors, the top interlayer dielectric layer including a plurality of via holes disposed on the ferroelectric capacitors;
a plurality of plate electrodes formed in the top interlayer dielectric layer and extending into respective ones of the via holes in the top interlayer dielectric layer to contact top surfaces of at least two neighboring ones of the ferroelectric; and
a hydrogen barrier layer pattern interposed between the ferroelectric capacitors and the top interlayer dielectric layer and extending along sidewalls of the ferroelectric capacitors and an edge portion of the top surfaces of the ferroelectric capacitors, the via holes of the top interlayer dielectric layer extending through the hydrogen barrier layer to expose the top surfaces of the ferroelectric capacitors.

9. The memory device of claim 8, further comprising:
a slit type contact hole penetrating the top interlayer dielectric layer to expose plate electrodes arranged on at least one row; and
a main plate line covering the silt type contact hole.

10. The memory device of claim 8, wherein the plate electrodes are local plate lines, each of which directly contacts the top surfaces of ferroelectric capacitors arranged on at least two rows.

11. The memory device of claim 8, wherein the ferroelectric capacitors comprise stacked capacitors including a bottom electrode, a ferroelectric pattern and a top electrode and wherein each of the plate electrodes directly contacts at least two neighboring top electrodes.

* * * * *